(12) United States Patent
Ding

(10) Patent No.: US 11,957,006 B2
(45) Date of Patent: Apr. 9, 2024

(54) DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Caihua Ding, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 924 days.

(21) Appl. No.: 16/965,611

(22) PCT Filed: Mar. 17, 2020

(86) PCT No.: PCT/CN2020/079571
§ 371 (c)(1),
(2) Date: Jul. 29, 2020

(87) PCT Pub. No.: WO2021/103352
PCT Pub. Date: Jun. 3, 2021

(65) Prior Publication Data
US 2023/0180546 A1    Jun. 8, 2023

(30) Foreign Application Priority Data

Nov. 25, 2019   (CN) .......................... 201911167912.7

(51) Int. Cl.
*H10K 59/131* (2023.01)
*H10K 59/80* (2023.01)

(52) U.S. Cl.
CPC ......... *H10K 59/131* (2023.02); *H10K 59/873* (2023.02)

(58) Field of Classification Search
CPC ........... H01L 2224/83203; H01L 2224/83224; H01L 2224/83201; H01L 2224/83208;
(Continued)

(56) References Cited

U.S. PATENT DOCUMENTS

| | | |
|---|---|---|
| 2011/0233545 A1 | 9/2011 | Shin et al. |
| 2013/0199824 A1* | 8/2013 | Lee ...................... H05K 1/0298 174/250 |
| 2017/0040386 A1 | 2/2017 | Miyamoto et al. |
| 2021/0305195 A1* | 9/2021 | Tsukao ................... H01L 24/27 |
| 2022/0108969 A1* | 4/2022 | Fujita ................ H01L 23/49811 |

FOREIGN PATENT DOCUMENTS

| | | |
|---|---|---|
| CN | 1675754 A | 9/2005 |
| CN | 103247588 A | 8/2013 |

(Continued)

*Primary Examiner* — Mohammad A Rahman
(74) *Attorney, Agent, or Firm* — PV IP PC; Wei Te Chung; Zhigang Ma

(57) ABSTRACT

A display device includes a display panel and an integrated circuit chip configured with a plurality of first bonding terminals spaced apart from each other. The display panel is provided with a plurality of second bonding terminals, and a first insulating layer is disposed between the first bonding terminals and the second bonding terminals. A plurality of electrically conductive particles are provided on the second bonding terminals and penetrate the first insulating layer so that the electrically conductive particles are in contact with the first bonding terminals.

17 Claims, 5 Drawing Sheets

(58) Field of Classification Search
CPC ............... H01L 2224/753; H01L 24/83; H01L 24/29; H01L 24/32; H01L 2224/29309; H01L 2224/29311; H01L 2224/29313; H01L 2224/29339; H01L 2224/29344; H01L 2224/29347; H01L 2224/29486; H01L 2224/32227; H01L 2224/32503; H01L 2224/8381; H01L 2224/05624; H01L 2224/05647; H01L 2224/2919; H01L 2224/2929; H01L 2224/293; H01L 2224/29387; H01L 2224/2939; H01L 2224/75263; H01L 2224/8314; H01L 2224/83141; H01L 2224/83192; H01L 2224/83424; H01L 2224/83447; H01L 2224/83855; H01L 2924/3511; H01L 2924/37001; H01L 24/33; H01L 2224/3201; H01L 2224/321; H01L 2224/331; H10K 59/131; H10K 59/873; H10K 59/129; H10K 59/40

See application file for complete search history.

(56) References Cited

FOREIGN PATENT DOCUMENTS

| CN | 105934816 A |   | 9/2016 |
|----|-------------|---|--------|
| CN | 106405892 A | * | 10/2016 |
| CN | 106405892 A |   | 2/2017 |
| CN | 107577094 A |   | 1/2018 |
| CN | 107784952 A |   | 3/2018 |
| CN | 108882552 A |   | 11/2018 |
| CN | 110444110 A |   | 11/2019 |

\* cited by examiner

DISPLAY DEVICE

BACKGROUND OF INVENTION

1. Field of Invention

The present invention relates to a technical field of displays, and particularly to, a display device.

2. Related Art

Currently, chip on polyimide (COP) bonding technology has become one of the high-end bonding technologies commonly developed in display panel industries. The COP bonding technology has an advantage that it can significantly reduce costs. In addition, development of light-emitting diode (LED) technologies makes it possible to bend displays, and displays with ultra-narrow bezel are more attractive to consumers. The COP bonding technology is used to directly bond integrated circuit chips (ICs) to terminal areas of display panels, which can further reduce spacing of borders.

The COP bonding technology is to dispose a plurality of bump terminals spaced apart from each other on ICs, and then bond the bump terminals to display panels through an anisotropic conductive film (ACF) to realize electrical signal transmission. Under a combined effect of temperature, pressure, and time, electrical conduction between ICs and display panels in a vertical direction and insulation in a horizontal direction are realized by conductive particles in the ACF adhesive.

However, during COP bonding processes, resin materials in ACF adhesives melt at high temperature and exhibit fluidity. The conductive particles in the ACF adhesives will be pressed into space between the bump terminals as adhesive materials flow, thereby easily causing adjacent bump terminals to be electrically conductive in a transverse direction, resulting in short circuits.

A technical problem is that during the COP bonding processes, the conductive particles in the ACF adhesives are pressed into space between the bump terminals as adhesive materials flow, thereby causing electrical conduction between adjacent bump terminals in a transverse direction, resulting in short circuits.

SUMMARY OF INVENTION

The present application provides a display device, comprising a display panel and an integrated circuit chip configured with a plurality of first bonding terminals spaced apart from each other; wherein the display panel is provided with a plurality of second bonding terminals, a first insulating layer is disposed between the first bonding terminals and the second bonding terminals, and a plurality of electrically conductive particles are provided on the second bonding terminals and penetrate the first insulating layer so that the electrically conductive particles are in contact with the first bonding terminals; wherein the first insulating layer has a thickness less than or equal to one tenth of a diameter of each of the electrically conductive particles, and the first insulating layer comprises at least one of polyimide and acrylic.

In one embodiment, the thickness of the first insulating layer is greater than or equal to one twentieth of the diameter of each of the electrically conductive particles.

In one embodiment, a liquid groove is disposed between adjacent two of the first bonding terminals, and a second insulating layer is disposed on a lateral side of each of the first bonding terminals in the liquid groove.

In one embodiment, a gap is provided between the second insulating layers on adjacent two of the first bonding terminals.

In one embodiment, the second insulating layer covers the entire lateral side of the first bonding terminal.

In one embodiment, the second insulating layer has a thickness greater than or equal to one twentieth of a spacing between adjacent two of the first bonding terminals.

In one embodiment, the second insulating layer has a thickness less than or equal to one tenth of the spacing between adjacent two of the first bonding terminals.

In one embodiment, the display panel comprises a substrate; an array substrate disposed on the substrate; and a light-emitting layer, a touch layer, and an encapsulation layer disposed in a stack arrangement on the array substrate; wherein the array substrate comprises a display area and a bonding area, and the second bonding terminals are disposed in the bonding area.

The present application further provides a display device, comprising a display panel and an integrated circuit chip configured with a plurality of first bonding terminals spaced apart from each other; wherein the display panel is provided with a plurality of second bonding terminals, a first insulating layer is disposed between the first bonding terminals and the second bonding terminals, and a plurality of electrically conductive particles are provided on the second bonding terminals and penetrate the first insulating layer so that the electrically conductive particles are in contact with the first bonding terminals.

In one embodiment, the first insulating layer has a thickness less than or equal to one tenth of a diameter of each of the electrically conductive particles.

In one embodiment, the thickness of the first insulating layer is greater than or equal to one twentieth of the diameter of each of the electrically conductive particles.

In one embodiment, a liquid groove is disposed between adjacent two of the first bonding terminals, and a second insulating layer is disposed on a lateral side of each of the first bonding terminals in the liquid groove.

In one embodiment, a gap is provided between the second insulating layers on adjacent two of the first bonding terminals.

In one embodiment, the second insulating layer covers the entire lateral side of the first bonding terminal.

In one embodiment, the second insulating layer has a thickness greater than or equal to one twentieth of a spacing between adjacent two of the first bonding terminals.

In one embodiment, the second insulating layer has a thickness less than or equal to one tenth of the spacing between adjacent two of the first bonding terminals.

In one embodiment, the first insulating layer comprises at least one of polyimide and acrylic.

In one embodiment, the display panel comprises a substrate; an array substrate disposed on the substrate; and light-emitting layer, a touch layer, and an encapsulation layer disposed in a stack arrangement on the array substrate; wherein the array substrate comprises a display area and a bonding area, and the second bonding terminals are disposed in the bonding area.

The present invention has advantageous effects as follows: using a combined effect of the first insulating layer and the second insulating layer, two insulating protection lines are provided to prevent a short circuit from being caused by electrical conduction between the adjacent first bonding terminals in the transverse direction. In addition, under the circumstance that vertical bonding area between the first bonding terminals and the second bonding terminals remains unchanged, there is no need to reduce a diameter of each of the electrically conductive particles, thereby difficulty in processing is reduced, a selection range of the diameter of each of the electrically conductive particles is increased in a bonding process, and purchase cost is saved.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

Figure 1:
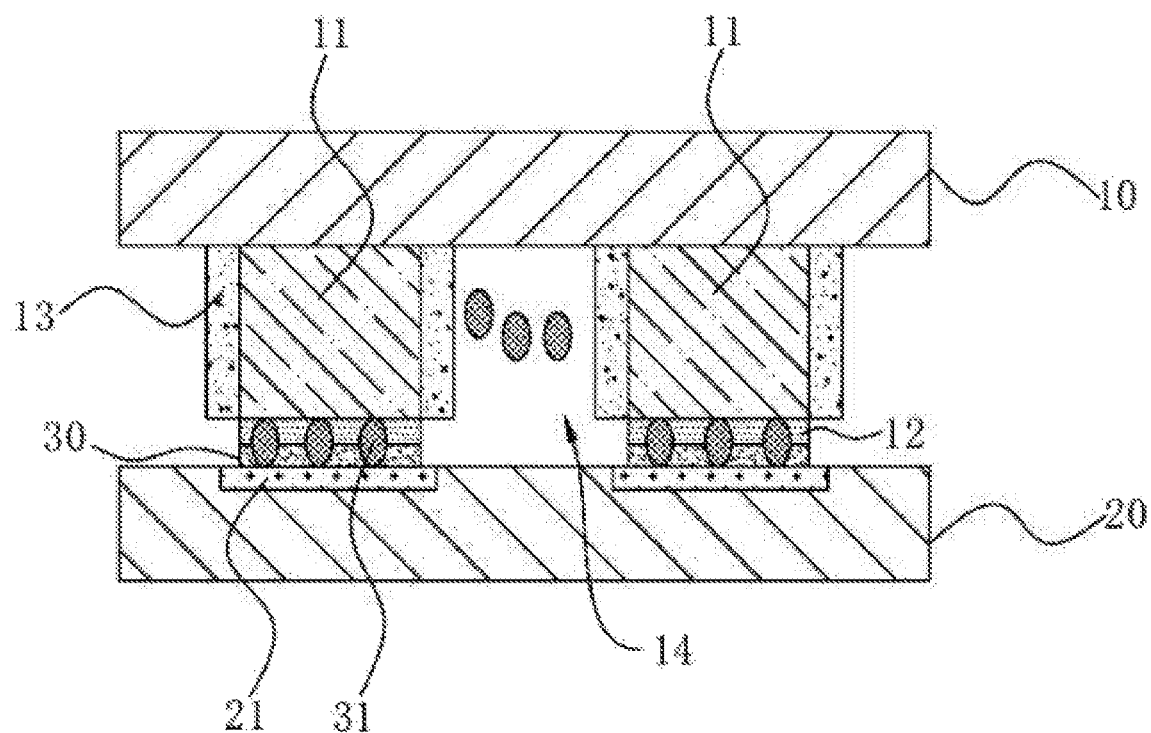
FIG. 1 is schematic structural view of a display device in accordance with an embodiment of the present invention.

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto. The same reference numerals in the drawings denote the same elements.

The present application is aimed to solve the problem that during chip on polyimide (COP) bonding processes, electrically conductive particles in anisotropic conductive film (ACF) adhesives are pressed into space between bump terminals as adhesive material flows, thereby causing electrical conduction between adjacent bump terminals in a transverse direction, resulting in short circuits.

As shown in FIG. 1, a display device includes a display panel 20 and an integrated circuit chip 10. The integrated circuit chip 10 is configured with a plurality of first bonding terminals 11 spaced apart from each other. The display panel 20 is provided with a plurality of second bonding terminals 21 corresponding to the first bonding terminals 11.

It should be noted that the display panel 20 may be a flexible display panel 20 or a flexible organic electroluminescent display panel 20.

It should be noted that the first bonding terminals 11 may be arranged side by side in a length direction along the integrated circuit chip 10. The first bonding terminals 11 may be arranged in an array.

Specifically, a first insulating layer 12 is disposed between the first bonding terminals 11 and the second bonding terminals 21, and a plurality of electrically conductive particles 31 are provided on the second bonding terminals 21 and penetrate the first insulating layer 12 so that the electrically conductive particles 31 are in contact with the first bonding terminals 11.

When the integrated circuit chip 10 is to be bonded to the display panel 20, the first insulating layer 12 is firstly formed on the first bonding terminals 11, and then the first bonding terminals 11 are aligned with the second bonding terminals after a conductive adhesive layer 3 containing the plurality of electrically conductive particles 31 are formed on the second bonding terminals 21. The integrated circuit chip 10 and the display panel 20 are pressed together at a high temperature. Under a combined reaction of temperature and pressure, the electrically conductive particles 31 are piercing the first insulating layer 12 to contact the first bonding terminals 11, thereby realizing electrical connection between the first bonding terminals 11 and the second binding terminals 21, and achieving electrical connection between the integrated circuit chip 10 and the display panel 20 in a vertical direction. With an isolation effect of the first insulating layer 12, the electrically conductive particles 31 inserted into the first insulating layer 12 are isolated from each other, which not only can better achieve insulation of the integrated circuit chip 10 from the display panel 20 in a horizontal direction, but also utilize the first insulating layer 12 to restrict movement of the electrically conductive particles 31, thereby the electrically conductive particles 31 can be prevented from flowing into space between adjacent two of the first bonding terminals 11 with a conductive adhesive, so that the electrically conductive particles 31 are prevented from aggregating, thereby avoiding a short circuit resulting from electrical conduction between adjacent two of the first bonding terminals 11 in a transverse direction.

It should be noted that for those skilled in the art, the higher the resolution of the display panel 20 is, the higher the requirements for arithmetic and data storage capabilities of the integrated circuit chip 10 are. As a result, number of the second bonding terminals 21 for bonding the integrated circuit chip 10 on the display panel 20 will increase. In a case where an overall area of the integrated circuit chip 10 remains unchanged, a spacing between the first bonding terminals 11 will become smaller and smaller. Using the first insulating layer 12 can ensure that vertical bonding area between the first bonding terminals 11 and the second bonding terminals 21 remain unchanged. That is, under a circumstance that vertical electrical conduction between the first bonding terminals 11 and the second bonding terminals 21 is not affected, there is no need to prevent the electrically conductive particles 31 from aggregating by reducing a diameter of each of the electrically conductive particles 31, so that a short circuit resulting from electrical conduction between adjacent two of the first bonding terminals 11 in a transverse direction. Therefore, difficulty in processing is mitigated, a selection range of the diameter of each of the electrically conductive particles 31 is increased in a bonding process, and purchase cost is saved.

It should be noted that the electrically conductive particles 31 are generally a multi-layered spherical structure, and the electrically conductive particles 31 each have a diameter ranges between 3~6 microns according to actual needs of different products. The electrically conductive particles 31 may be formed by plating a high-hardness metal on an outer layer of polymer; wherein the polymer the thickness of the first insulating layer is greater than or equal to one twentieth of the diameter of each of the electrically conductive particles may be polystyrene, and the high-hardness metal may be cobalt or nickel.

Specifically, the first insulating layer 12 has a thickness less than or equal to one tenth of the diameter of each of the electrically conductive particles 31, and the thickness of the first insulating layer 12 is greater than or equal to one twentieth of the diameter of each of the electrically conductive particles 31.

The first insulating layer 12 may be made of a polymer material with low hardness, such as at least one of polyimide and acrylic, thereby facilitating piercing of the electrically conductive particles 31 into the first insulating layer 21 for contact with the first bonding terminals 11, and also enabling good insulating effect and viscosity of the first insulating layer 12.

By designing the material and thickness of the first insulating layer 12, piercing of the electrically conductive particles 31 into the first insulating layer 12 can be ensured when boding the integrated circuit chip 10, as the first insulating layer 12 performs the good insulation effect, thereby enabling electrical connection between the first bonding terminals 11 and the second bonding terminals 21 through the electrically conductive particles 31.

Specifically, a liquid groove 14 is disposed between adjacent two of the first bonding terminals 11, and a second insulating layer 13 is disposed on a side of each of the first bonding terminals 11 in the liquid groove 14.

When pressing together the integrated circuit chip 10 and the display panel 20, even if some of the electrically conductive terminals 31 flow into the liquid grove 14 between adjacent first bonding terminals 11 along with the conductive adhesive, the second insulating layer 13 servers to protect the side of each of the first bonding terminals 11, thereby further enhancing the insulting effect, and preventing the electrically conductive particles 31 from aggregating in the liquid groove 14, which gives rise to a short circuit caused by electrical conduction between the first bonding terminals 11 in the transverse direction.

It should be noted that FIG. 1 only illustrates the case where the second insulating layer 13 is provided on all lateral sides of each of the first bonding terminals 11. In a practical embodiment, the second insulating layer 13 may be disposed only on lateral sides of any one of the first bonding terminals 11.

Furthermore, the second insulating layer 13 covers the entire lateral side of the first bonding terminal 11.

Furthermore, a gap is provided between the second insulating layers 13 on adjacent two of the first bonding terminals.

In one embodiment, the second insulating layer 13 has a thickness greater than or equal to one twentieth of a spacing between adjacent two of the first bonding terminals 11, and the thickness of the second insulating layer 13 is less than or equal to one tenth of the spacing between adjacent two of the first bonding terminals 11.

By designing the thickness of the second insulating layer 13, not only can the second insulating layer 13 serve to provide well protection, but also can the liquid groove 14 be ensured to preserve enough space, thereby avoiding poor display caused by a situation that the electrically conductive particles 31 flow to other space when the integrated circuit chip 10 and the display panel 20 are pressed together.

It should be noted that the second insulating layer 13 may be disposed on peripheral sides of the first bonding terminal 11, or may be disposed on a lateral side of one of the adjacent first bonding terminals 11 opposite to the other one of the first bonding terminals 11.

It should be noted that the second insulating layer 13 is made of a material including but is not limited to silicon nitride, silicon oxide, polyimide or acrylic.

Figure 2:
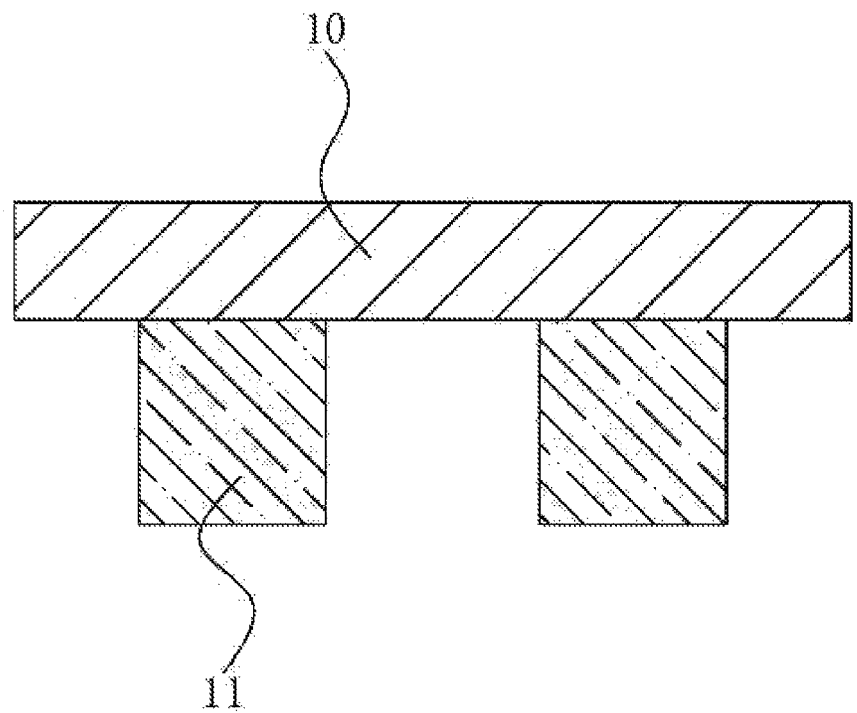
FIGS. 2 and 3 are schematic views showing structures fabricated by steps of forming a first insulating layer and a second insulating layer, respectively, in accordance with an embodiment of the present invention.
Figure 3:
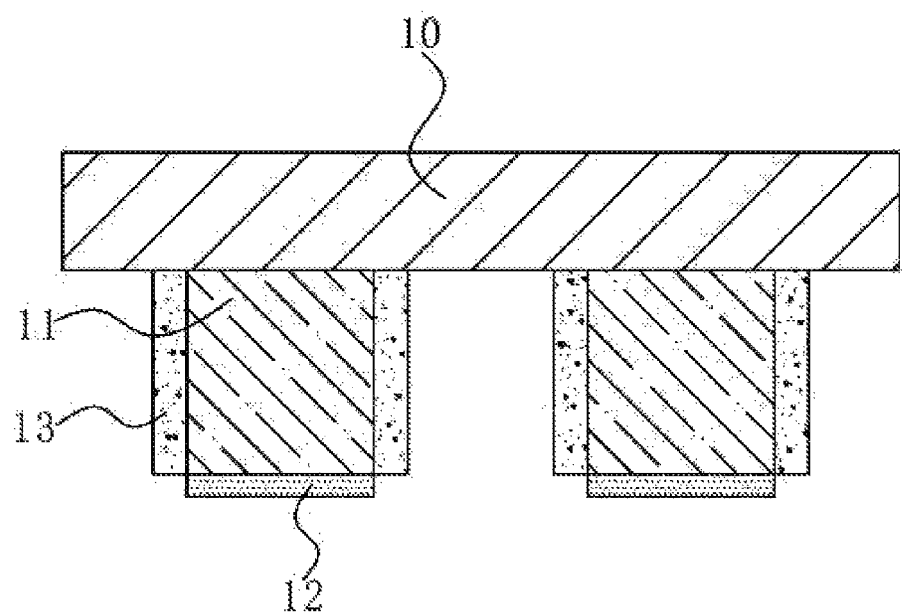

As shown in FIGS. 2 and 3, FIGS. 2 and 3 are schematic views showing structures fabricated by steps of forming the first insulating layer 12 and the second insulating layer 13, respectively, in accordance with an embodiment of the present invention.

As shown in FIG. 2, the integrated circuit chip 10 is configured with the first bonding terminals 11.

As shown in FIG. 3, the second insulating layer 13 is formed on lateral sides of each of the first bonding terminals 11 by coating or film formation, and the first insulating layer 12 is formed on a bottom side of each of the first bonding terminals 11 by coating or film formation.

Figure 4:
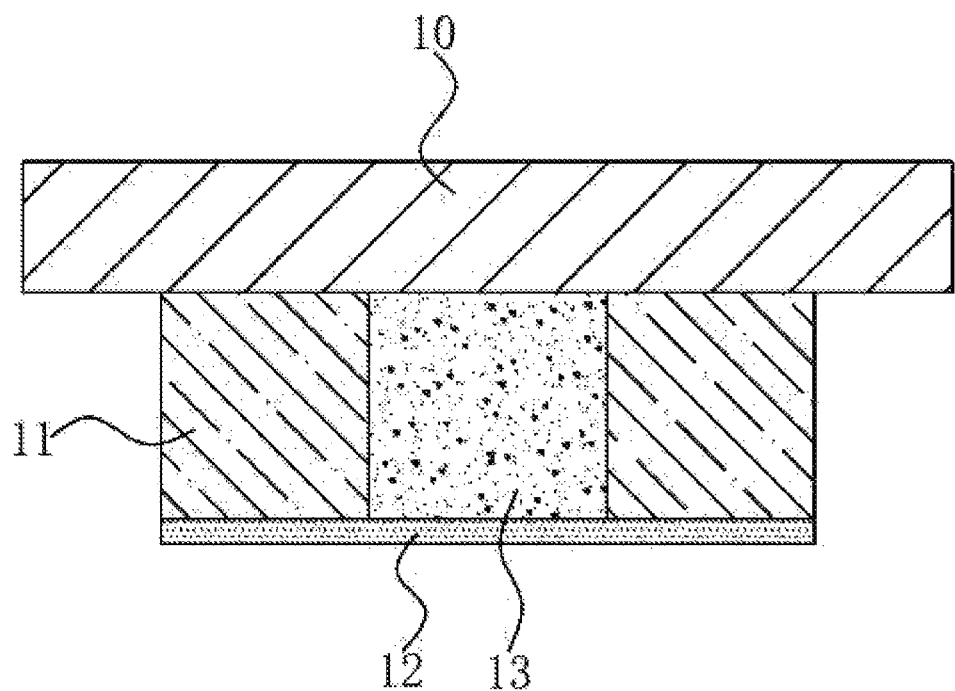
FIGS. 4 and 5 are schematic views showing structures fabricated by steps of forming a first insulating layer and a second insulating layer, respectively, in accordance with another embodiment of the present invention.
Figure 5:
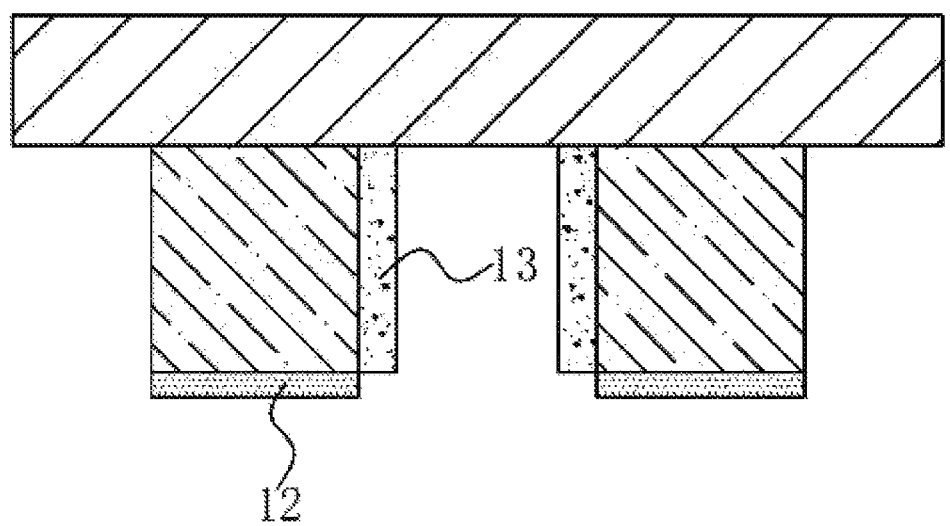

As shown in FIGS. 4 and 5, FIGS. 4 and 5 are schematic views showing structures fabricated by steps of forming the first insulating layer 12 and the second insulating layer 13, respectively, in accordance with another embodiment of the present invention.

As shown in FIG. 4, the second insulating layer 13 is filled in the liquid groove 14 between the first binding terminals 11 by coating or film forming, and the first insulating layer 12 is covered on bottom sides of the first binding terminals 11.

As shown in FIG. 5, the first insulating layer 12 and the second insulating layer 13 are patterned through chemical etching or laser etching.

Figure 6:
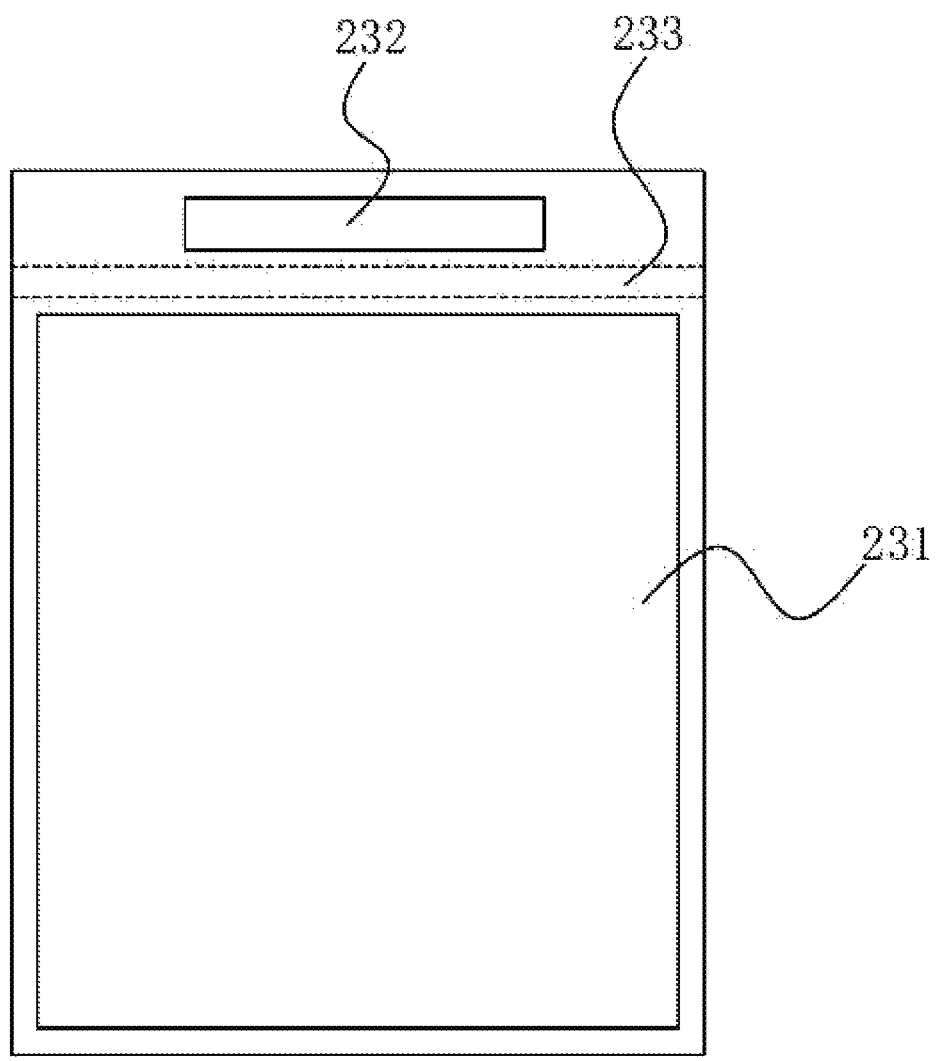
FIG. 6 is a schematic plan view of an array substrate in accordance with an embodiment of the present invention.
Figure 7:
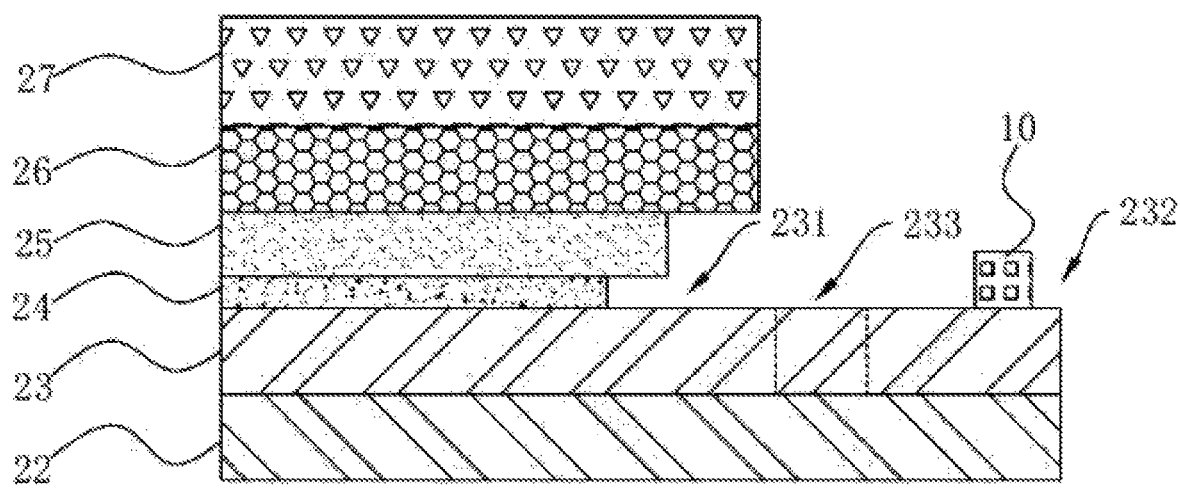
FIG. 7 is a schematic structural view of a display panel in accordance with an embodiment of the present invention.

In one embodiment, as shown in FIGS. 6 and 7, the display panel 20 includes a substrate 22, an array substrate 23 disposed on the substrate 22, and a light-emitting layer 24, a touch layer 26, and an encapsulation layer 27 disposed in a stack arrangement on the array substrate 23.

The array substrate 23 includes a display area 231 and a bonding area 232, and the second bonding terminals 21 are disposed in the bonding area 232.

The substrate 22 is a flexible substrate, and the array substrate 23 is a flexible array substrate. A bent area 233 is further provided between the display area 231 and the bonding area 232, so that the integrated circuit chip 10 can be bent to a rear side of the substrate 22 after the integrated circuit chip 10 is bonded in the bonding area 232, thereby reducing a frame width of the display panel 20.

The touch layer 26 may be bonded to the light-emitting layer 24 through an optical adhesive layer 25, and the encapsulation layer 27 may be an encapsulation cover plate.

The present invention has advantageous effects as follows: using a combined effect of the first insulating layer 12 and the second insulating layer 13, two insulating protection lines are provided to prevent a short circuit from being caused by electrical conduction between the adjacent first bonding terminals 11 in the transverse direction. In addition, under the circumstance that vertical bonding area between the first bonding terminals 11 and the second bonding terminals 21 remains unchanged, there is no need to reduce a diameter of each of the electrically conductive particles 31, thereby difficulty in processing is mitigated, a selection range of the diameter of each of the electrically conductive particles 31 is increased in a bonding process, and purchase cost is saved.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A display device, comprising:
a display panel; and
an integrated circuit chip configured with a plurality of first bonding terminals spaced apart from each other;
wherein the display panel is provided with a plurality of second bonding terminals, a first insulating layer is disposed between the plurality of first bonding terminals and the plurality of second bonding terminals, and a plurality of electrically conductive particles are provided on the plurality of second bonding terminals and penetrate the first insulating layer so that the plurality of electrically conductive particles are in contact with the plurality of first bonding terminals;
wherein the first insulating layer has a thickness less than or equal to one-tenth of a diameter of each of the plurality of electrically conductive particles, and the first insulating layer comprises at least one of polyimide and acrylic;
wherein a liquid groove is disposed between adjacent two of the plurality of first bonding terminals, and a second insulating layer is disposed on a lateral side of each of the plurality of first bonding terminals in the liquid groove.

2. The display device of claim 1, wherein the thickness of the first insulating layer is greater than or equal to one-twentieth of the diameter of each of the plurality of electrically conductive particles.

3. The display device of claim 1, wherein a gap is provided between the second insulating layers on adjacent two of the plurality of first bonding terminals.

4. The display device of claim 1, wherein the second insulating layer covers the entire lateral side of the plurality of first bonding terminals.

5. The display device of claim 1, wherein the second insulating layer has a thickness greater than or equal to one twentieth of a spacing between adjacent two of the plurality of first bonding terminals.

6. The display device of claim 5, wherein the second insulating layer has a thickness less than or equal to one tenth of the spacing between adjacent two of the plurality of first bonding terminals.

7. The display device of claim 1, wherein the display panel comprises:
a substrate;
an array substrate disposed on the substrate; and
a light-emitting layer, a touch layer, and an encapsulation layer disposed in a stack arrangement on the array substrate;
wherein the array substrate comprises a display area and a bonding area, and the plurality of second bonding terminals are disposed in the bonding area.

8. A display device, comprising:
a display panel; and
an integrated circuit chip configured with a plurality of first bonding terminals spaced apart from each other;
wherein the display panel is provided with a plurality of second bonding terminals, a first insulating layer is disposed between the plurality of first bonding terminals and the plurality of second bonding terminals, and a plurality of electrically conductive particles are provided on the plurality of second bonding terminals and penetrate the first insulating layer so that the plurality of electrically conductive particles are in contact with the plurality of first bonding terminals, and
wherein a liquid groove is disposed between adjacent two of the plurality of first bonding terminals, and a second insulating layer is disposed on a lateral side of each of the first plurality of bonding terminals in the liquid groove.

9. The display device of claim 8, wherein the first insulating layer has a thickness less than or equal to one tenth one-tenth of a diameter of each of the plurality of electrically conductive particles.

10. The display device of claim 9, wherein the thickness of the first insulating layer is greater than or equal to one-twentieth of the diameter of each of the plurality of electrically conductive particles.

11. The display device of claim 8., wherein a gap is provided between the second insulating layers on adjacent two of the plurality of first bonding terminals.

12. The display device of claim 8, wherein the second insulating layer covers the entire lateral side of the plurality of first bonding terminals.

13. The display device of claim 8, wherein the second insulating layer has a thickness greater than or equal to one twentieth of a spacing between adjacent two of the plurality of first bonding terminals.

14. The display device of claim 13, wherein the second insulating layer has a thickness less than or equal to one tenth of the spacing between adjacent two of the plurality of first bonding terminals.

15. The display device of claim 8, wherein the first insulating layer comprises at least one of polyimide and acrylic.

16. The display device of claim 8, wherein the display panel comprises:
a substrate;
an array substrate disposed on the substrate; and
a light-emitting layer, a touch layer, and an encapsulation layer disposed in a stack arrangement on the array substrate;
wherein the array substrate comprises a display area and a bonding area, and the plurality of second bonding terminals are disposed in the bonding area.

17. A display device, comprising:
a display panel; and
an integrated circuit chip configured with a plurality of first bonding terminals spaced apart from each other;
wherein the display panel is provided with a plurality of second bonding terminals, a first insulating layer is disposed between the plurality of first bonding terminals and the plurality of second bonding terminals, and a plurality of electrically conductive particles are provided on the plurality of second bonding terminals and penetrate the first insulating layer so that the plurality of electrically conductive particles are in contact with the plurality of first bonding terminals;
wherein the first insulating layer has a thickness less than or equal to one-tenth of a diameter of each of the plurality of electrically conductive particles; the thickness of the first insulating layer is greater than or equal to one-twentieth of the diameter of each of the plurality of electrically conductive particles; and the first insulating layer comprises at least one of polyimide and acrylic; and
wherein a liquid groove is disposed between adjacent two of the plurality of first bonding terminals, and a second insulating layer is disposed on a lateral side of each of the plurality of first bonding terminals in the liquid groove.

\* \* \* \* \*